(12) United States Patent
Kobayashi

(10) Patent No.: US 10,567,690 B2
(45) Date of Patent: Feb. 18, 2020

(54) IMAGING APPARATUS, IMAGING SYSTEM, AND MOVING BODY HAVING CAPACITANCE OF AN ELECTRIC PATH EXTENDING FROM A SUPPLY UNIT TO A SELECTION UNIT

(71) Applicant: CANON KABUSHIKI KAISHA, Tokyo (JP)

(72) Inventor: Hideo Kobayashi, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/108,663

(22) Filed: Aug. 22, 2018

(65) Prior Publication Data

US 2019/0068906 A1 Feb. 28, 2019

(30) Foreign Application Priority Data

Aug. 28, 2017 (JP) ................................ 2017-163473

(51) Int. Cl.
*H04N 5/378* (2011.01)
*H04N 5/357* (2011.01)
*H01L 27/146* (2006.01)

(52) U.S. Cl.
CPC ............. *H04N 5/378* (2013.01); *H04N 5/357* (2013.01); *H01L 27/14609* (2013.01)

(58) Field of Classification Search
CPC ................................ H04N 5/378; H04N 5/357
See application file for complete search history.

(56) References Cited

U.S. PATENT DOCUMENTS

| | | | |
|---|---|---|---|
| 2009/0225211 A1* | 9/2009 | Oike .................... | H03M 1/1023 348/308 |
| 2012/0008028 A1 | 1/2012 | Egawa | |
| 2013/0032695 A1* | 2/2013 | Ishibashi ................ | H04N 5/378 250/208.1 |
| 2015/0244388 A1* | 8/2015 | Hashimoto ............. | H03M 1/34 348/322 |
| 2016/0165166 A1* | 6/2016 | Koh ...................... | H04N 5/3575 348/302 |
| 2017/0085817 A1* | 3/2017 | Yeh ........................ | H03M 1/34 |

FOREIGN PATENT DOCUMENTS

| | | |
|---|---|---|
| JP | 2012-19411 A | 1/2012 |
| JP | 2013-251677 A | 12/2013 |

* cited by examiner

*Primary Examiner* — Nicholas G Giles
(74) *Attorney, Agent, or Firm* — Canon U.S.A., Inc. IP Division

(57) ABSTRACT

A capacitance of a first line which transmits a ramp signal having a potential changed by a first changing amount is controlled to be larger than a capacitance of a second line which transmits a ramp signal having a potential changed by a second changing amount which is larger than the first changing amount.

26 Claims, 11 Drawing Sheets

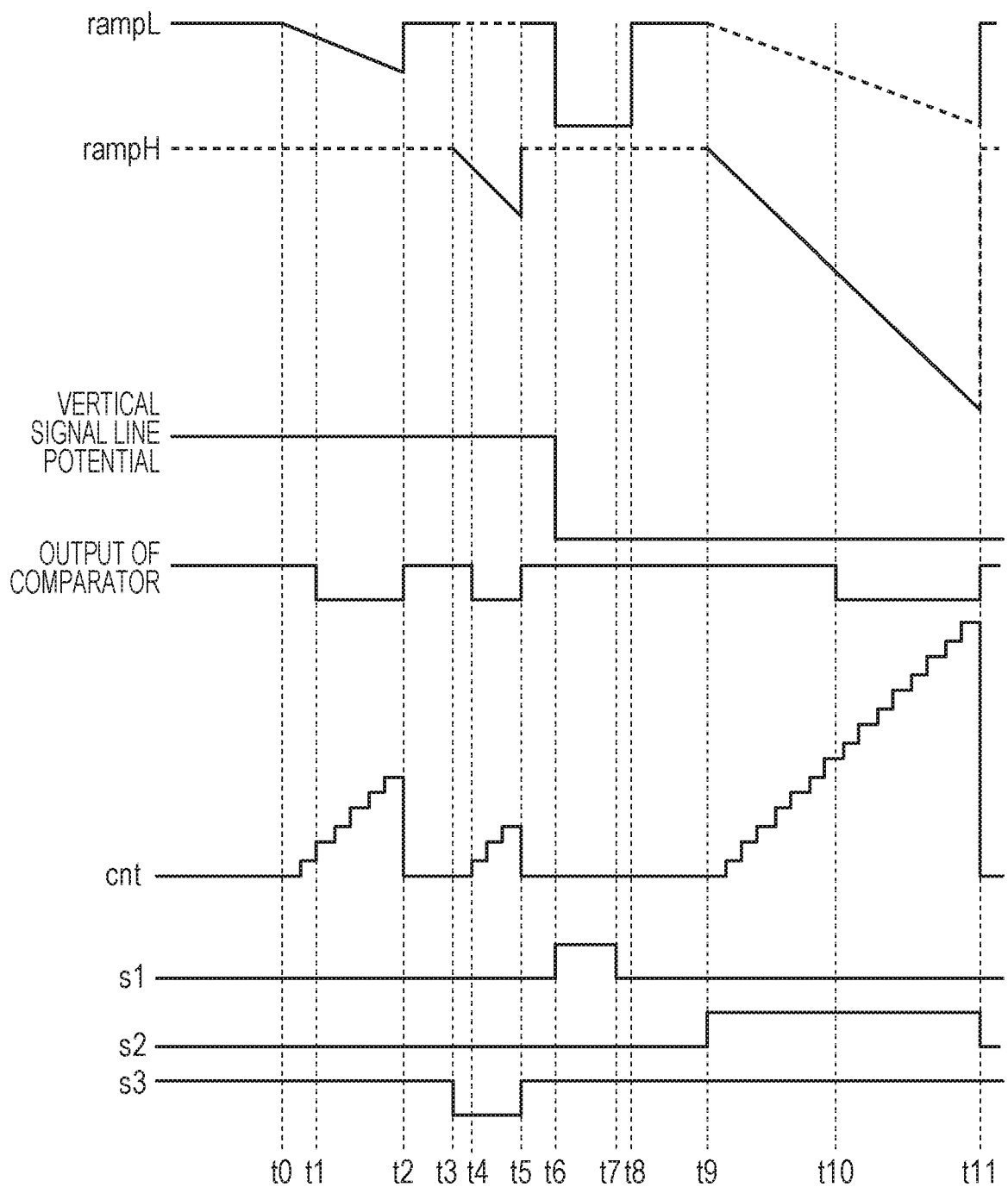

IMAGING APPARATUS, IMAGING SYSTEM, AND MOVING BODY HAVING CAPACITANCE OF AN ELECTRIC PATH EXTENDING FROM A SUPPLY UNIT TO A SELECTION UNIT

BACKGROUND OF THE INVENTION

Field of the Invention

The aspect of the embodiments relates to an imaging apparatus, an imaging system, and a moving body.

Description of the Related Art

An imaging apparatus having an analog/digital (AD) conversion unit including a comparison unit has been used.

Japanese Patent Laid-Open No. 2013-251677 discloses an imaging apparatus including a first line which transmits a ramp signal having a potential changed by a first changing amount per unit time and a second line which transmits a ramp signal having a potential changed by a second changing amount which is larger than the first changing amount per unit time. This imaging apparatus is configured such that one of the first and second lines is selectively connected to a comparison unit.

SUMMARY OF THE INVENTION

According to an aspect of the present disclosure, an apparatus includes a supply unit configured to supply a first ramp signal having a potential changed by a first changing amount per unit time and a second ramp signal having a potential changed by a second changing amount which is larger than the first changing amount per unit time, a first line configured to transmit the first ramp signal, a second line configured to transmit the second ramp signal, and analog/digital conversion units each of which is configured to be connected to the first and second lines, include a selection unit which outputs one of the first and second ramp signals and a comparison unit which performs a first comparison between the ramp signal output from the selection unit and an analog signal, and obtain a digital signal corresponding to the analog signal by the first comparison. A first capacitance of an electric path extending from the supply unit through the first line to the selection unit is larger than a second capacitance of an electric path extending from the supply unit through the second line to the selection unit.

Further features of the disclosure will become apparent from the following description of exemplary embodiments with reference to the attached drawings.

BRIEF DESCRIPTION OF THE DRAWINGS

FIG. 3 is a diagram illustrating an AD conversion operation performed by the imaging apparatus.

DESCRIPTION OF THE EMBODIMENTS

In the imaging apparatus disclosed in Japanese Patent Laid-Open No. 2013-251677, capacitance of the first line and capacitance of the second line have not been discussed. Accordingly, there is room for improvement of accuracy of AD conversion using the ramp signal having a potential changed by the first changing amount.

Embodiments of an imaging apparatus will be described with reference to the accompanying drawings. Note that a transistor means an N-type transistor in a description below unless otherwise noted. However, the embodiments below are not limited to an N-type transistor and a P-type transistor may be appropriately used. In this case, potentials of a gate, a source, and a drain of a transistor may be appropriately changed relative to descriptions in the embodiments. In a case of the transistor operating as a switch, for example, a low level and a high level of a potential to be supplied to a gate are reversed relative to the descriptions in the embodiments.

First Embodiment

Outline of Imaging Apparatus

Figure 1:
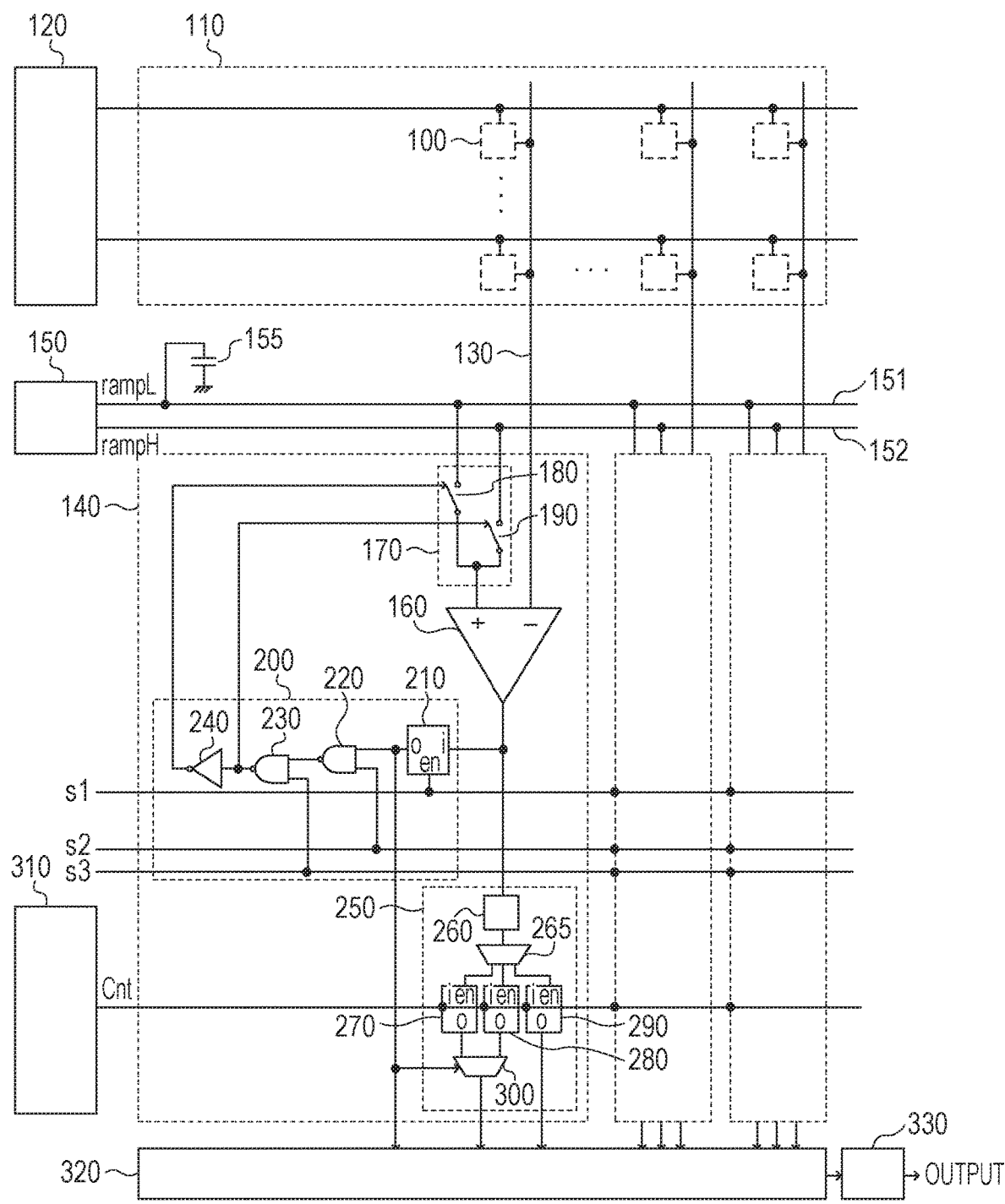
FIG. 1 is a diagram illustrating a configuration of an imaging apparatus.

FIG. 1 is a diagram schematically illustrating an imaging apparatus according to a first embodiment.

The imaging apparatus includes a pixel array 110 including pixels 100 arranged in a plurality of rows and columns, and a vertical scanning circuit 120 which scans the pixels 100 for each row. Each of the pixels 100 includes a photoelectric conversion unit not illustrated. The photoelectric conversion unit generates charge in accordance with an amount of light incident on the pixel 100. The imaging apparatus further includes vertical signal lines 130 arranged so as to correspond to the columns of the pixels 100 and column AD converters 140 (AD converters) arranged so as to correspond to the columns of the pixels 100. The imaging apparatus further includes a ramp generator 150 (a ramp signal supply unit) and a capacitor element 155.

Each of the column AD converters 140 includes a comparator 160 (a comparison unit), a selection unit 170, a column controller 200, and a memory unit 250. The selection unit 170 includes switches 180 and 190.

The column controller 200 includes a memory 210, NAND gates 220 and 230, and an INV gate 240. The memory unit 250 includes a pulse generator 260, a selector 265, memories 270, 280, and 290, and a selector 300. The imaging apparatus further includes a counter 310 which outputs a count signal cnt obtained by counting of a clock to the column AD converters 140 in the individual columns, a horizontal scanning circuit 320 which reads signals from the column AD converters 140 in the individual columns by scanning the column AD converters 140 in the individual columns, and an output circuit 330. The ramp generator 150 outputs a ramp signal rampL (a first ramp signal) having a potential changed by a first changing amount per unit time to a first line 151. The ramp generator 150 outputs a ramp signal rampH (a second ramp signal) having a potential changed by a second changing amount which is larger than the first changing amount per unit time to a second line 152.

Furthermore, a timing generator (a controller), not illustrated, supplies control signals s1, s2, and s3 to the column controller 200.

In FIG. 1, a position of connection of the capacitor element 155 to the first line 151 is illustrated. Specifically, the capacitor element 155 is connected to an electric path between one of the plurality of column AD converters 140 (a column AD converter 140 in a left end in FIG. 1) which has the shortest electric path to the ramp generator 150 and the ramp generator 150.

Operation of Imaging Apparatus

Operation of each of the column AD converters 140 will be described with reference to FIG. 2. Each of the column AD converters 140 of this embodiment selects one of the ramp signals rampL and rampH to be used in AD conversion based on magnitudes of signals output from the pixels 100 based on incident light. It is assumed here that the operation described herein corresponds to AD conversion on signals output from the pixels 100 on which low luminance light is incident. Specifically, the operation corresponds to AD conversion performed on signals output from the pixels 100 based on incident light using the ramp signal rampL, for example.

Figure 2:
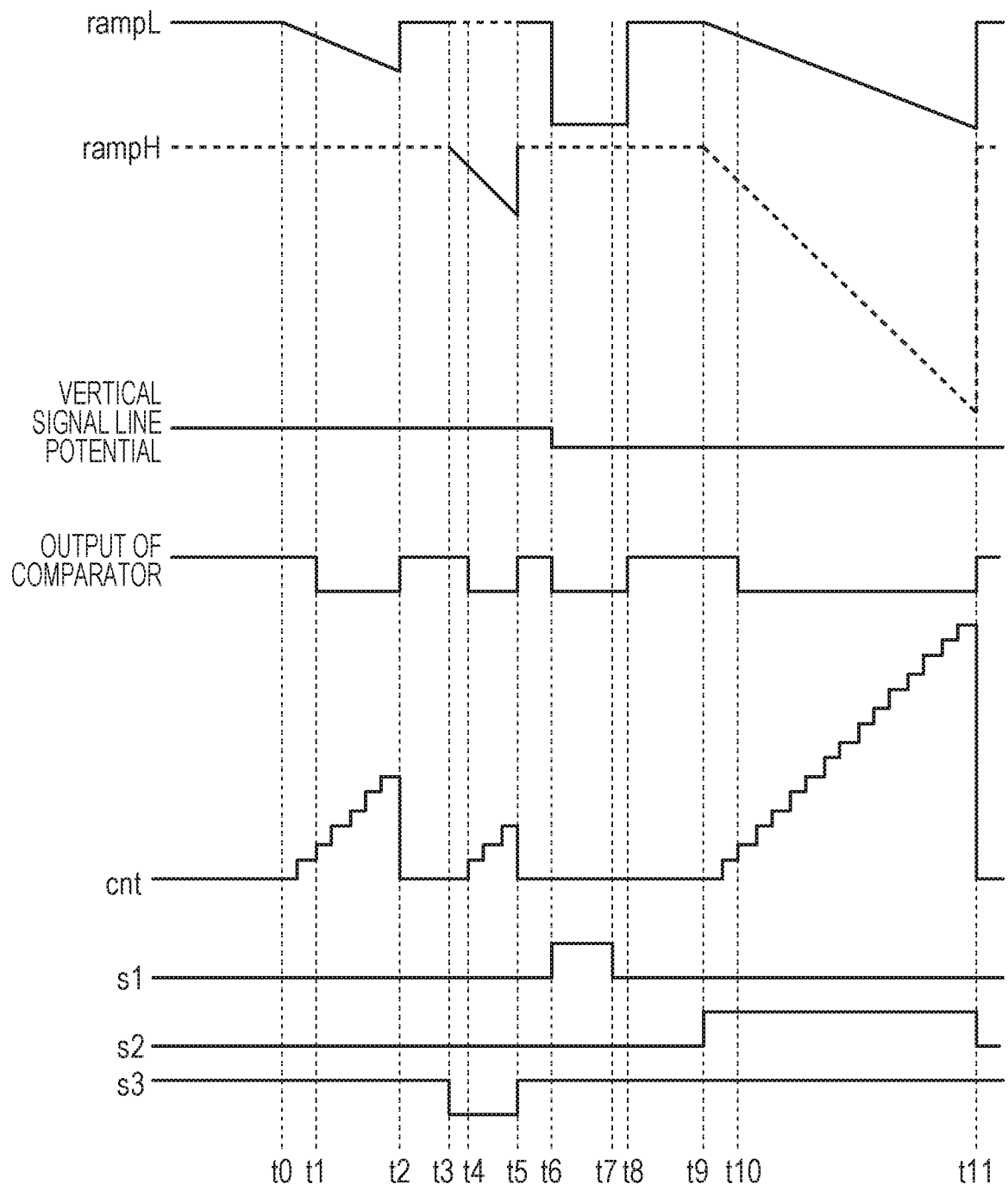
FIG. 2 is a diagram illustrating an AD conversion operation performed by the imaging apparatus.

Furthermore, in FIG. 2, the photoelectric conversion units of the pixels 100 store electrons based on the light. Specifically, potentials of signals output from the pixels 100 are lowered as an amount of light incident on the pixels 100 is increased. Furthermore, a term "amplitude" is used where appropriate in this embodiment. The term "amplitude" indicates an amount of change from a certain reference potential. Specifically, potentials of the signals output from the pixels 100 are lowered and amplitude of the signals is increased as an amount of light incident on the pixels 100 is increased.

At a time point t0, a control signal s2 is in a low level and a control signal s3 is in a high level. Accordingly, in the selection unit 170, the switch 180 is in an On state and the switch 190 is in an Off state. Therefore, the first line 151 is connected to a non-inversion input node of the comparator 160 and the ramp signal rampL is supplied to the non-inversion input node.

Furthermore, potentials of the vertical signal lines 130 are in a reset level of the pixels 100. In this case, a voltage of the non-inversion input node of the comparator 160 is larger than a voltage of an inversion input node, and therefore, an output of the comparator 160 is in a high level.

In a period of time from the time point t0 to a time point t2, the ramp generator 150 lowers the potential of the ramp signal rampL by the first changing amount. Hereinafter, a reset potential of the ramp signals rampL and rampH is referred to as a "ramp reset potential". Furthermore, a timing when change of the potentials of the ramp signals rampL and rampH is started is referred to as a "ramp start timing". Furthermore, the counter 310 starts counting-up of a count signal cnt when change of the potential of one of the signals rampL and rampH is started. Here, the counter 310 starts counting-up of the count signal cnt when the change of the potential of the ramp signal rampL is started. Hereinafter, a timing when the counter 310 starts count-up is referred to as a count start timing. Ideally, a ramp start timing and a count start timing coincide with each other.

At a time point t1, the potential of the ramp signal rampL becomes lower than that of the vertical signal lines 130. Accordingly, an output of the comparator 160 is changed from a high level to a low level. The pulse generator 260 generates a pulse (a one-shot pulse) which is in a high level only in a predetermined period of time in accordance with a change of the output of the comparator 160. The predetermined period of time typically corresponds to a length for a several periods of the clock. The selector 265 supplies the pulse to the memory 270. By this operation, the count signal cnt is written in the memory 270 at the time point t1. This is a digital signal obtained as a result of the AD conversion using the ramp signal rampL relative to the reset level.

At the time point t2, the ramp generator 150 resets the potential of the ramp signal rampL to the potential of the ramp start timing. By this, the level of the output of the comparator 160 is returned from the low level to the high level. Furthermore, the counter 310 resets the count signal cnt to the value of the count start timing.

Thereafter, at a time point t3, the timing generator, not illustrated, brings a control signal s3 into a low level. By this, in the selection unit 170, the switch 180 is turned off and the switch 190 is turned on. Accordingly, the second line 152 is connected to the non-inversion input node of the comparator 160 and the ramp signal rampH is supplied to the non-inversion input node.

In a period of time from the time point t3 to a time point t5, the ramp generator 150 lowers the potential of the ramp signal rampH by the second changing amount which is larger than the first changing amount. Furthermore, the counter 310 counts up the count signal cnt when the change of the potential of the ramp signal rampH is started.

At a time point t4, the potential of the ramp signal rampH becomes lower than that of the vertical signal lines 130. Accordingly, a level of the output of the comparator 160 is changed from a high level to a low level. The pulse generator 260 generates a pulse (a one-shot pulse) which is in a high level only in a predetermined period of time in accordance with the change of the output of the comparator 160. The selector 265 supplies the pulse to the memory 280. By this operation, the count signal cnt is written in the memory 280 at the time point t4. This is a digital signal obtained as a result of the AD conversion using the ramp signal rampH relative to the reset level.

At the time point t5, the ramp signal rampH and the count signal cnt are reset. A level of the output of the comparator 160 is returned from the low level to the high level. Furthermore, since the control signal s3 is returned to the high level, the ramp signal rampL is input again to the non-inversion input of the comparator 160.

In a period of time from the time point t5 to a time point t6, the pixels 100 starts output of signals based on light (optical signals) to the vertical signal lines 130. Accordingly, the potential of the vertical signal lines 130 is brought into a level corresponding to the optical signals (an example of analog signals based on the optical signals). Although not illustrated, a correlated double sampling (CDS) circuit may be provided in a preceding stage relative to the comparator 160. In this case, the signals based on the optical signals are obtained by subtracting noise signals of the pixels 100 from the optical signals. Furthermore, an amplifier may be provided in the preceding stage relative to the comparator 160. In this case, the signals based on the optical signals are obtained by amplifying the optical signals.

At the time point t6, the ramp generator 150 lowers the potential of the ramp signal rampL to a level of a determination threshold value. The comparator 160 compares the determination threshold value with the signals based on the optical signals.

As described above, a case where the pixels 100 which receive light of low luminance perform the AD conversion on signals to be output is illustrated in FIG. 2. Therefore, the potential of the vertical signal lines 130 becomes larger than that of the ramp signal rampL. As for amplitude, amplitude of the vertical signal lines 130 is smaller than that of the determination threshold value of the ramp signal rampL. Accordingly, an output of the comparator 160 is brought into a low level. At this time, the control signal s1 is brought into a high level in a period from the time point t6 to a time point t7 so that information on the low level, which is the determination result, is written to the memory 210.

At a time point t8, the ramp generator 150 returns the potential of the ramp signal rampL to the potential of the ramp start timing. By this, a level of an output of the comparator 160 is returned to the high level.

Thereafter, at a time point t9, the timing generator, not illustrated, brings the control signal s2 into a high level. By this, the determination result written in the memory 210 is reflected in connection states of the switches in the selection unit 170.

Since the information on a low level is written in the memory 210, the switch 180 is in an On state and the switch 190 is in an Off state in the selection unit 170. Accordingly, the first line 151 is connected to the non-inversion input node of the comparator 160 and the ramp signal rampL is supplied to the non-inversion input node.

After the time point t9, the ramp generator 150 lowers the potential of the ramp signal rampL by the first changing amount. Furthermore, the counter 310 counts up the count signal cnt. At a time point t10, an output of the comparator 160 is brought into a low level. By this, a result of the AD conversion using the ramp signal rampL based on the optical signal is written in the memory 290.

At a time point t11, the ramp signal rampL and the count signal cnt are reset. In the example illustrated in FIG. 2, a result of the AD conversion written in the memory 270 is selected and output from the selector 300 in accordance with the determination result written in the memory 210. Specifically, a result of the AD conversion corresponding to the reset level generated using a ramp signal having a potential changed by a changing amount per unit time which is the same as that of the ramp signal used in the AD conversion performed on the signals based on the optical signals is output from the selector 300.

After the time point t11, the determination results and the AD conversion results which are written in the memories 210, 270, and 290 are horizontally transferred through the horizontal scanning circuit 320. In the output circuit 330, signal output is performed after an S-N process or the like is performed using the AD conversion results of the memories 270 and 290. In this case, a different process is performed in accordance with a result of a determination performed by the memory 210. This process will be described hereinafter. As described above, when a signal level of the vertical signal lines 130 corresponds to low luminance, the ramp signal rampL having a smaller potential changing amount per unit time is selected and used. By this, the AD conversion may be performed with high resolution and high accuracy while random noise caused by a quantization error is reduced.

Next, a case where signals output the pixels 100 which receive light of high luminance are subjected to AD conversion is described with reference to FIG. 3. The same process as FIG. 2 is performed until a time point t6.

In FIG. 3, a potential reduction amount (amplitude) of the vertical signal lines 130 is large at the time point t6, and therefore, a high level of an output of the comparator 160 remains. Therefore, information on the high level is written in the memory 210.

Specifically, a result written in the memory 210 is changed in accordance with a result of a comparison between the signal level of the vertical signal lines 130 and the determination threshold value.

Accordingly, the first line 152 is connected to the non-inversion input node of the comparator 160 and the ramp signal rampH is supplied to the non-inversion input node at a time point t9 onwards.

At a time point t10, a result of the AD conversion using the ramp signal rampH relative to the signal level is written in the memory 290. In the example illustrated in FIG. 3, a result of the AD conversion written in the memory 280 is selected and output from the selector 300 in accordance with the determination result written in the memory 210. After a time point t11, the determination results and the AD conversion results which are written in the memories 210, 280, and 290 are horizontally transferred through the horizontal scanning circuit 320. Here, the output circuit 330 performs a process of applying a gain corresponding to a ratio of inclination of the ramp signal rampL to inclination of the ramp signal rampH to the AD conversion result and the like in accordance with the determination result written in the memory 210, in addition to the S-N process before signal is not output.

The description above is made provided that a ramp start timing and a count start timing coincide with each other. When the ramp start timing and the count start timing are shifted from each other, the AD conversion result may be modified so that an AD conversion error caused by the shift is reduced. Furthermore, the output circuit 330 may correct an offset difference caused by a shift between slope operation start timings of the ramp signals rampL and rampH or a shift between transmission delays. As described above, when a signal level of the vertical signal lines 130 corresponds to high luminance, the ramp signal rampH having larger inclination is selected and used. By this, although random noise of the column AD converters 140 caused by the quantization error or the like is increased, optical shot noise which appears in the vertical signal lines 130 is dominant, and accordingly, a reading time may be reduced while total influence to the random noise is small.

Effect of Capacitor Element 155 Connected to First Line 151

In this embodiment, the capacitor element 155 is added to the first line 151 which transmits the ramp signal rampL. By this, improvement of accuracy of the AD conversion may be realized. Hereinafter, this effect will be described.

The ramp signals rampL and rampH include noise (typically random noise). When the noise is input to the comparator 160, timings when an output of the comparator 160 is changed illustrated in FIGS. 2 and 3 are shifted from the time points t1 and t4 which are original timings in which the output of the comparator 160 is changed. Accordingly, a result of the AD conversion becomes different from an original result to be obtained. This occurs in common in the column AD converters 140 connected to both the first line 151 and the second line 152. Accordingly, in a case where a signal processor which is not illustrated in this embodiment and which is disposed outside the imaging apparatus generates an image using a result of the AD conversion, lateral stripe (lateral stripe noise) may appear in an image. A result of a determination as to whether the lateral stripe noise is noticeable in the image depends on a magnitude of variation of noise in individual pixels. Specifically, when the variation of noise in individual pixels is large, the noise caused by the ramp signal included in the result of the AD conversion is relatively small, and therefore, the lateral stripe noise is less noticeable. On the other hand, when the variation of noise in individual pixels is small, the noise caused by the ramp signal included in the result of the AD conversion is relatively large, and therefore, the lateral stripe noise is noticeable.

An optical shot noise becomes dominant in the noise of the pixels in accordance with increase in an amount of incident light. Here, in a case of light amount which realizes a dominant optical shot noise, the magnitude relationship of noises in individual pixels corresponds to the magnitude relationship of optical shot noises. Therefore, in a region of a light amount which realizes dominant optical shot noise, noises in the individual pixels depend on a light amount.

In FIG. 1, the ramp signal rampH is used for the AD conversion on optical signals output from the pixels 100 on which light of high luminance which has large variation of noise in the individual pixels is incident. Therefore, the optical shot noise is dominant relative to the noise of the ramp signal rampH in the noise included in the result of the AD conversion, and therefore, the lateral stripe noise is less noticeable in the image. Accordingly, influence of the noise included in the ramp signal rampH may be ignored.

On the other hand, when optical signals of the pixels 100 on which light of low luminance is incident is to be subjected to the AD conversion, contribution of the optical shot noise is small in the noise included in the result of the AD conversion, and therefore, contribution of the ramp signal rampL becomes relatively larger. Therefore, the lateral stripe noise is significant in the image. To reduce the lateral stripe noise, it is important to suppress the noise of the ramp signal rampL used for the AD conversion.

According to the present disclosure, the capacitor element 155 is added to the first line 151 which transmits the ramp signal rampL so as to suppress the noise of the ramp signal rampL. In this way, the noise of the ramp signal rampL may be suppressed.

A capacitor element may be assigned to the ramp signal rampH, and in this case, a capacitance value of a capacitor element assigned to the ramp signal ramp L is set larger than a capacitance value of the capacitor element assigned to the ramp signal rampH. In one embodiment, when a capacitor element is not assigned to the ramp signal rampH and a capacitor element is assigned only to the ramp signal rampL, a reduced chip area may be attained since a capacitor element assigned to the ramp signal ramp H may be omitted. Accordingly, an effect of suppression of fabrication cost of the imaging apparatus may also be attained.

Note that a configuration of the capacitor element 155 is not particularly specified. A capacitor element having a Metal-Insulator-Metal (MIM) structure may be used as the capacitor element 155. Alternatively, a capacitor element having a Metal-Oxide-Semiconductor (MOS) structure may be used as the capacitor element 155.

Configuration and Operation of Ramp Generator

Figure 6:
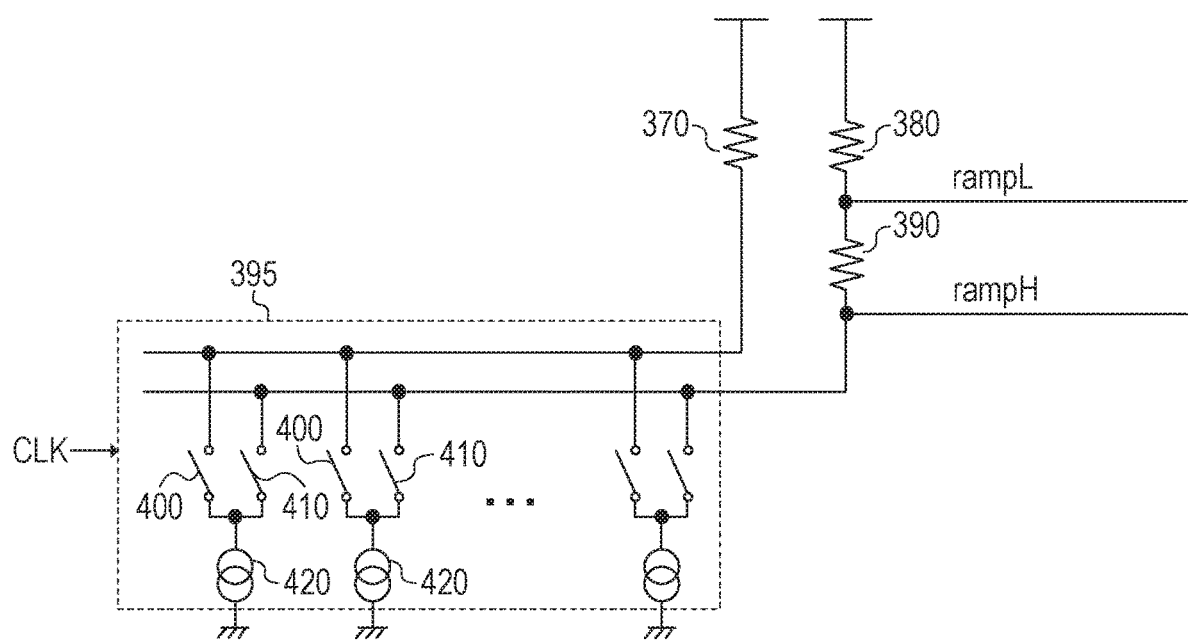
FIG. 6 is a diagram illustrating a configuration of a ramp generator.

FIG. 6 is a diagram illustrating an example of an equivalent circuit of the ramp generator 150. The ramp generator 150 includes resistors 370, 380, and 390 and a slope current generator 395. The slope current generator 395 includes a plurality of current sources 420, a plurality of switches 400, and a plurality of switches 410. A single switch 400 and a single switch 410 are connected to a single current source 420. In other words, a plurality of groups each of which includes a single current source 420, a single switch 400, and a single switch 410 are arranged in parallel.

At the ramp start timing (the time point t0 of FIG. 2, for example), all the switches 400 are in an On state and all the switches 410 are in an Off state. In this case, current of all the current sources 420 are supplied to the resistor 370, and both the ramp signal rampL and the ramp signal rampH have a ramp reset potential which is equivalent to a power source voltage. Thereafter, the On state and the Off state of the switches 400 and the switches 410 are changed on a group-by-group basis every time a value of a clock signal CLK supplied from the timing generator, not illustrated, is changed. By this, current supplied to the resistors 380 and 390 is increased as the value of the clock signal CLK is changed. Specifically, the slope current generator 395 operates as a digital/analog converter. By this, the potentials of both the ramp signals rampL and rampH are lowered. In this case, the potential of the ramp signal rampL is lowered due to voltage drop of the resistor 380, whereas the potential of the ramp signal rampH is lowered due to voltage drop of the two resistors 380 and 390. Accordingly, a potential changing amount of the ramp signal rampH is larger than that of the ramp signal rampL per unit time.

Further Effect of Capacitor Element 155

When the ramp generator 150 has the configuration illustrated in FIG. 6, thermal noise of the resistor 380 and current noise of the current sources 420 may be reduced by band restriction performed by the capacitor element 155 illustrated in FIG. 1. In addition, an effect of reduction of the current noise outside the chip which is to be mixed into a power source input terminal of the imaging apparatus may be attained.

Furthermore, since the capacitor element 155 is provided, influence of a step caused by an image pattern may be reduced in addition to the effect of the reduction of the lateral stripe noise described above. This process is described with reference to FIGS. 4A and 4B.

Figure 4A:
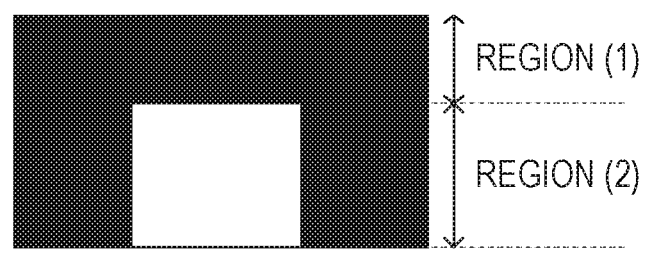
FIGS. 4A and 4B are diagrams schematically illustrating an amount of incident light in a pixel array.
Figure 4B:
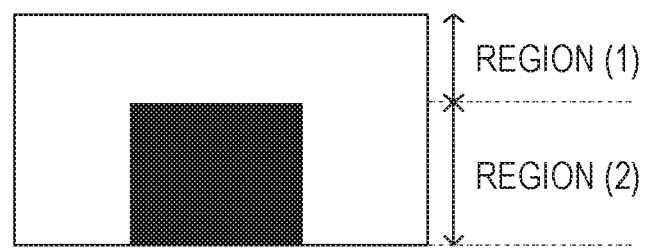

FIGS. 4A and 4B are diagrams schematically illustrating a pixel array.

First, in FIG. 4B, light of high luminance is incident on all columns of the pixels 100 in a region (1). Furthermore, light of high luminance is incident on a number of the pixels 100 and light of low luminance is incident on the other of the pixels 100 in a region (2). Here, in a case where an average output of the regions of the high luminance in the regions (1) and (2) is 5000 LSB, for example, random noise caused by optical shot noise is a square root of 5000 LSB, that is, 70 LSB over. Therefore, even if a step of noise of 1 LSB caused by the AD conversion is generated between the high luminance region in the region (1) and the high luminance region in the region (2), the difference is less noticeable due to the random noise.

On the other hand, in FIG. 4A, light of low luminance is incident on all the columns of the pixels 100 in the region (1). The light of the low luminance has the same light amount in all the columns of the pixels 100. Here, outputs of the comparators 160 in the column AD converters 140 in all the columns are simultaneously changed at the time of the AD conversion of signal levels (the time point t10 in FIG. 2).

On the other hand, the region (2) includes the pixels 100 on which light of high luminance is incident. Therefore, a timing when the outputs of the comparators 160 are changed in the column AD converters 140 in a number of the columns and a timing when the outputs of the comparators 160 are changed in the column AD converters 140 in the others of the columns are different from each other. Since the number of outputs of the comparators 160 which are simultaneously changed in the region (1) is different from that in the region (2), different AD conversion results may be obtained in the regions (1) and (2) even if light of the same amount is incident on the pixels 100 of the low luminance in the region (1) and the pixels 100 of the low luminance in the region (2). Hereinafter, this point will be described.

When the output of the comparator 160 is changed, a load capacitance is charged and discharged in an output node of the comparator 160. By this, transitional variation may be generated in a power source voltage supplied to the comparator 160. The variation varies the ramp signal rampL through a parasitic capacitance. Furthermore, the voltage variation caused by a change of the output of the comparator 160 varies a potential of an input node of the comparator 160 through a parasitic capacitance. The ramp signal rampL may also be varied due to this factor. Therefore, the variation of the ramp signal rampL in the AD conversion in the region (1) in which outputs of the comparators 160 of the column AD converters 140 in all the columns are simultaneously changed is larger than that in the AD conversion in the region (2). Accordingly, even if the same amount of light is incident on the pixels 100 of the low luminance in the region (1) and the pixels 100 of the low luminance in the region (2), different AD conversion results may be obtained. In this case, a step of luminance may be generated in an image in a boundary between the regions (1) and (2). This step is generated as lateral stripe, and therefore, it is likely that the step is visually recognized by human eyes as degradation of image quality.

The capacitor element 155 of this embodiment has an effect of less generating the step of luminance in the image. The capacitor element 155 may suppress the variation of the ramp signal rampL caused by the change of the output of the comparator 160. By this, even if the numbers of outputs of the comparators 160 which are simultaneously changed in the regions (1) and (2) are different from each other, the variation of the ramp signal rampL may be suppressed. Accordingly, an effect of less generating a step of luminance in the image is attained.

As described above, since the capacitor element 155 is added to the first line 151 which transmits the ramp signal rampL, a capacitance value of the first line 151 becomes larger than that of the second line 152 which transmits the ramp signal rampH. Specifically, a first capacitance of an electric path from the ramp generator 150 serving as a ramp signal supply unit to the selection unit 170 through the first line 151 is set larger than a second capacitance of an electric path from the ramp generator 150 to the selection unit 170 through the second line 152. By this, noise included in the AD conversion result obtained using the ramp signal rampL may be suppressed. Accordingly, image quality of an image including the AD conversion result obtained using the ramp signal rampL may be improved.

Other Examples of Connection of Capacitor Element 155 to First Line 151

A position of the connection between the capacitor element 155 and the first line 151 is not limited to the position illustrated in FIG. 1, the connection position illustrated in FIG. 1 is an example. As another example, a plurality of capacitor elements are connected to the first line 151 in a distributed manner. Although the effect of this embodiment may be attained even in this distributed connection, the connection illustrated in FIG. 1 is sought. This is because the lateral stripe noise has a noise component which is superposed on the column AD converters 140 in all the columns in common, and therefore, the lateral stripe noise is suppressed in the vicinity of the ramp generator 150 so that an effect of reduction of the lateral stripe noise may be enhanced.

Furthermore, a delay amount of the ramp signal rampL is increased as a length of an electric path from the ramp generator 150 is increased. It is preferable that, the capacitor element 155 is connected to the first line 151 in a position in the vicinity of the ramp generator 150 in terms of a difference among delay amounts of the ramp signal ramp L in the individual column AD converters 140. In the case where capacitor elements are connected to the first line 151 in the distributed manner, a delay amount of the ramp signal rampL is further increased in accordance with the length of the electric path from the ramp generator 150. By this, differences of the timings of the time points t1 and t10 illustrated in FIG. 2 among the columns are increased. Accordingly, in one embodiment, driving is performed taking an amount of the increase into consideration. Therefore, high speed processing of the imaging apparatus is difficult. As a result, the connection position illustrated in FIG. 1 is sought also in terms of high speed processing.

Note that the imaging apparatus may be configured such that a first substrate including the pixels 100 disposed thereon and a second substrate including the column AD converters 140 disposed thereon are laminated. In this case, the capacitor element 155 may be disposed only one of the first and second substrates. As another example, the capacitor element 155 may be disposed on a third substrate which is different from first and second substrates. The third substrate may include the ramp generator 150 disposed thereon. When heat which propagates to the capacitor element 155 is to be reduced, the capacitor element 155 may be disposed on the third substrate which is different from the first substrate including the pixels 100 disposed thereon and the second substrate including the column AD converters 140 disposed thereon.

Furthermore, this embodiment is not limited to the AD conversion units disposed in the columns of the pixels 100 as illustrated in FIG. 1. When the AD conversion units are disposed on the second substrate described above, for example, the plurality of AD conversion units may be disposed in a plurality of rows and a plurality of columns. In this case, each of the AD conversion units is a block of a part of the pixel array 110 and performs AD conversion on signals output from the pixels 100 disposed in the plurality of rows and the plurality of columns. Specifically, the pixel array 110 is divided into a plurality of blocks including the pixels 100 arranged in the plurality of rows and the plurality of columns, and each of the AD conversion units may perform AD conversion on signals output from the pixels 100 in a corresponding one of the plurality of blocks.

Figure 5:
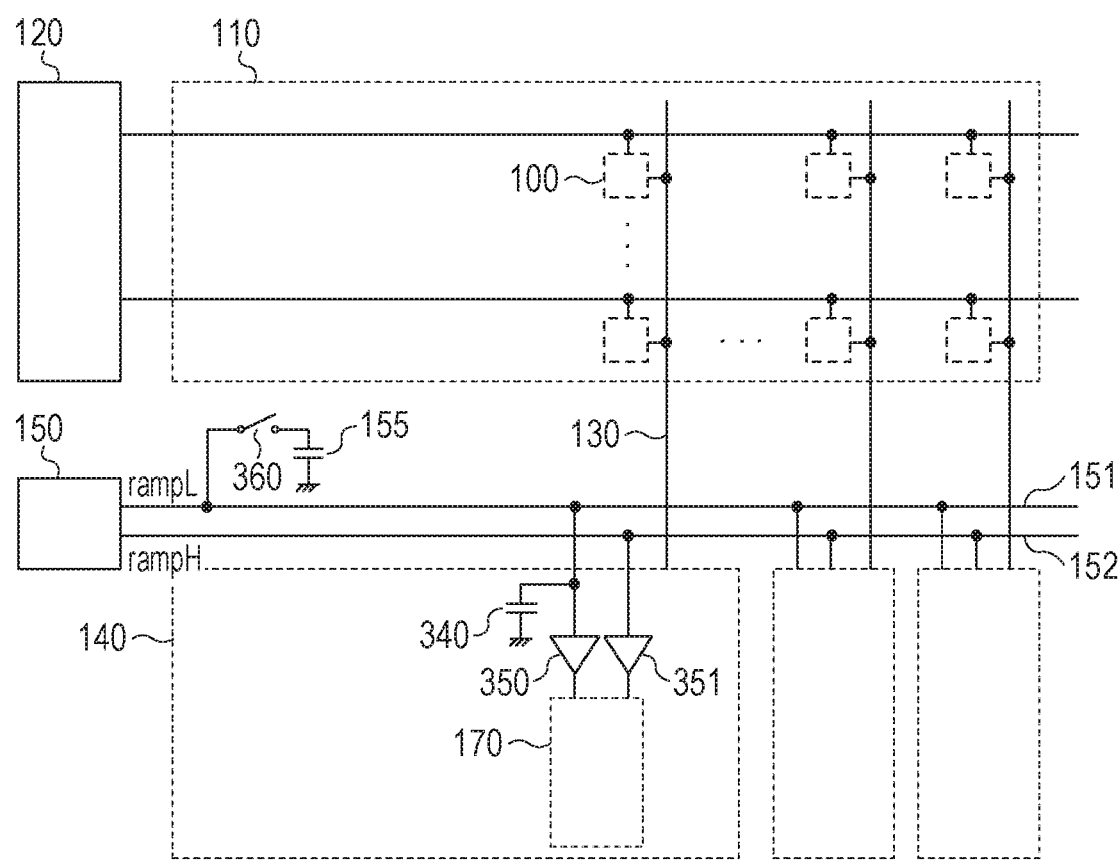
FIG. 5 is a diagram illustrating a configuration of an imaging apparatus.

Furthermore, as illustrated in FIG. 5, the capacitor element 155 may be connected to the first line 151 through a switch 360. For example, in an operation mode in which a speed of reset of the first line 151 is more important than the lateral stripe noise, the switch 360 is turned off. In this way, connection and disconnection of the capacitor element 155 to the first line 151 may be switched in accordance with a required condition.

Furthermore, a plurality of capacitor elements 155 may be connected to opposite ends of the first line 151. Specifically, in addition to the capacitor element 155 illustrated in FIG. 1, another capacitor element 155 may be disposed in a position which attains an electric path which is longer than a largest electric path to the column AD converter 140 from the ramp generator 150.

Moreover, instead of the connection of the capacitor element 155 to the first line 151, the first line 151 having a thickness larger than that of the second line 152 may be disposed. The thickness may be a thickness (a line width) in a plan view of the imaging apparatus or a thickness of a line.

Specifically, a capacitance of the first line 151 is set larger than that of the second line 152.

Furthermore, a buffer 350 (a first buffer) and a buffer 351 (a second buffer) may be disposed before the selection unit 170 as illustrated in FIG. 5. A source follower circuit or an amplifier may be used as the buffers. Since the first and second buffers are disposed, the ramp signal rampL is less varied due to a change of an output of the comparator 160, and therefore, the variation of the ramp signal rampL may be further suppressed.

Furthermore, when each of the column AD converters 140 includes the buffers 350 and 351, the selection unit 170 is connected in a following stage relative to the buffers 350 and 351. Specifically, the selection unit 170 connects one of the buffers 350 and 351 to the non-inversion input node of the comparator 160. An effect of the configuration will be described. In the region (1) of FIG. 4A, the column AD converters 140 in all the columns are connected to the first line 151. On the other hand, in the region (2), the column AD converters 140 in a number of the columns are connected to the first line 151. Therefore, the numbers of column AD converters 140 connected to the first line 151 in the regions (1) and (2) are different from each other. Accordingly, a parasitic capacitance of the input node of the comparator 160 connected to the first line 151 in the region (1) is larger than that in the region (2). A capacitance of the first line 151 is increased as the number of column AD converters 140 connected to the first line 151 is increased. Therefore, an amount of potential variation of the potential of the ramp signal rampL per unit time is reduced as the number of column AD converters 140 connected to the first line 151 is increased. Accordingly, accuracy of the AD conversion may be degraded due to a difference between the numbers of column AD converters 140 connected to the first line 151.

On the other hand, in a case where each of the column AD converters 140 in all the columns has the buffers 350 and 351 as illustrated in FIG. 5, the buffers 350 of the column AD converters 140 in all the columns are connected to the first line 151 in both the first and second regions (1) and (2) of FIG. 4A. Accordingly, degradation of the accuracy of the AD conversion caused by a difference between the numbers of column AD converters 140 connected to the first line 151 may be suppressed.

However, high-frequency potential variation of the input node of the comparator 160 which may not be followed by the buffer 350 may reach the first line 151 through an input/output capacitance of the buffer 350. Therefore, since not only the buffer 350 but also the capacitor element 155 connected to the first line 151 is disposed, noise may be more efficiently suppressed. That is, a capacitance of the first line 151 in the electric path from the ramp generator 150 to the first buffer is larger than that of the second line 152 in the electric path from the ramp generator 150 to the second buffer.

Second Embodiment

An imaging apparatus according to a second embodiment will be described mainly in portions different from the first embodiment.

Figure 7:
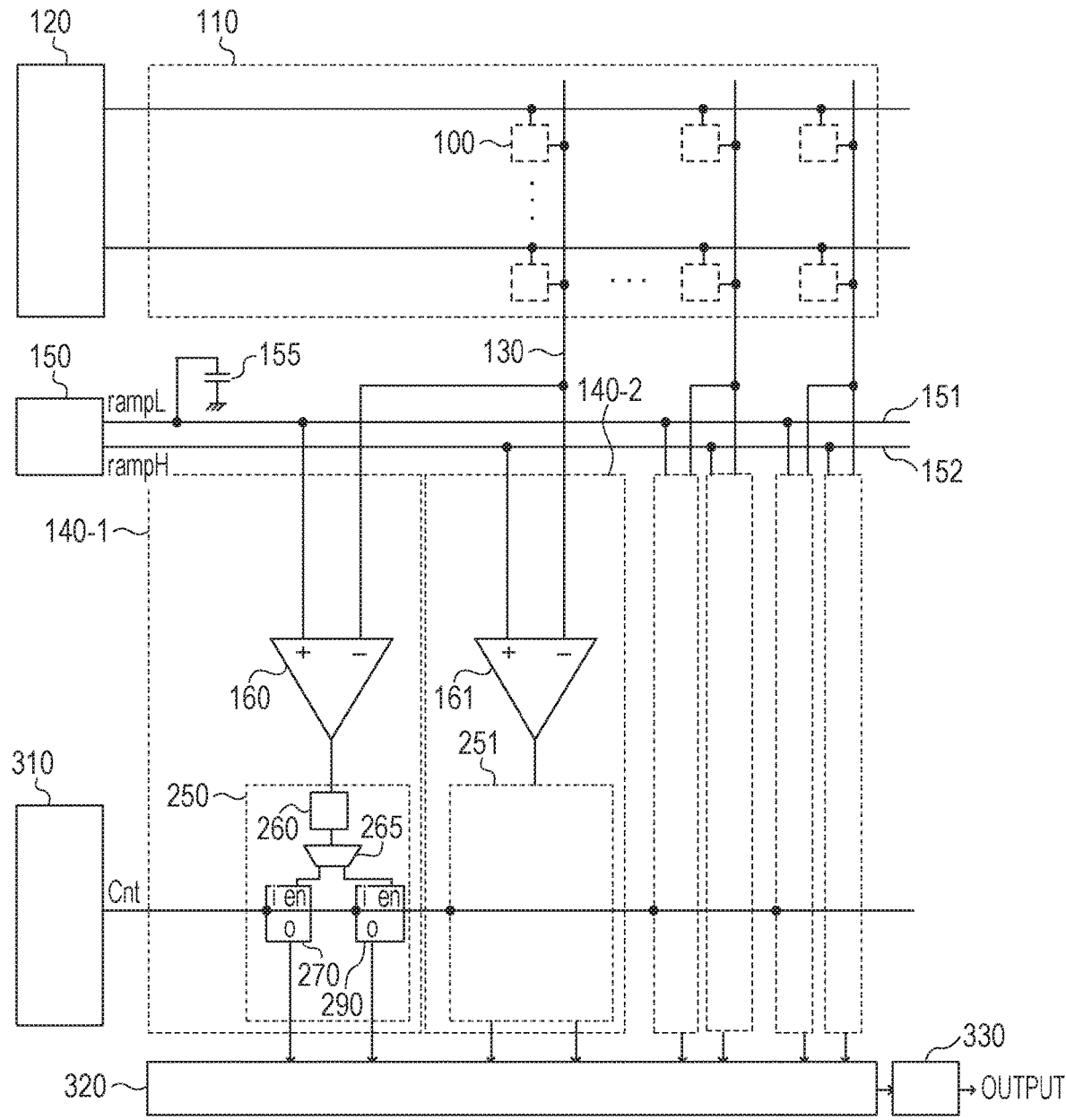
FIG. 7 is a diagram illustrating a configuration of an imaging apparatus.

FIG. 7 is a diagram illustrating a configuration of the imaging apparatus of this embodiment. In the imaging apparatus of the first embodiment, one column AD converter 140 is disposed for pixels 100 in one column. On the other hand, a column AD converter 140-1 (a first AD conversion unit) and a column AD converter 140-2 (a second AD conversion unit) are disposed for pixels 100 in one column in this embodiment. A comparator 160 included in the first AD conversion unit is connected to a first line 151, and a comparator 160 included in the second AD conversion unit is connected to a second line 152. In the first embodiment, one of the ramp signals rampL and rampH is selected as a ramp signal to be used in the AD conversion in accordance with a result of a comparison between signals based on optical signals of the pixels 100 and the determination threshold value. On the other hand, in this embodiment, the comparator 160 of the first AD conversion unit compares signals based on optical signals of the pixels 100 with a ramp signal rampL and the comparator 160 of the second AD conversion unit compares the signal based on the optical signals of the pixels 100 with a ramp signal rampH.

Furthermore, the column AD converters 140-1 and 140-2 includes memory units 250 and 251, respectively. Each of the memory units 250 and 251 includes a pulse generator 260, a selector 265, memories 270 and 290. The selector 265 outputs a pulse of the pulse generator 260 to the memory 270 at a time of AD conversion in a reset level. Furthermore, the selector 265 outputs a pulse of the pulse generator 260 to the memory 290 at a time of AD conversion on signals based on optical signals. The memory 270 holds a result of the AD conversion corresponding to the reset level. The memory 290 holds a result of the AD conversion corresponding to the signals based on optical signals.

Also in this embodiment, a capacitor element 155 is connected to a first line 151. With this configuration, a first capacitance of an electric path from the ramp generator 150 serving as a ramp signal supply unit to the comparator 160 through the first line 151 is set larger than a second capacitance of an electric path from the ramp generator 150 to a comparator 161 through the second line 152. The effect obtained by the imaging apparatus of the first embodiment using the capacitor element 155 connected to the first line 151 may be obtained by the imaging apparatus of this embodiment.

Third Embodiment

Figure 8:
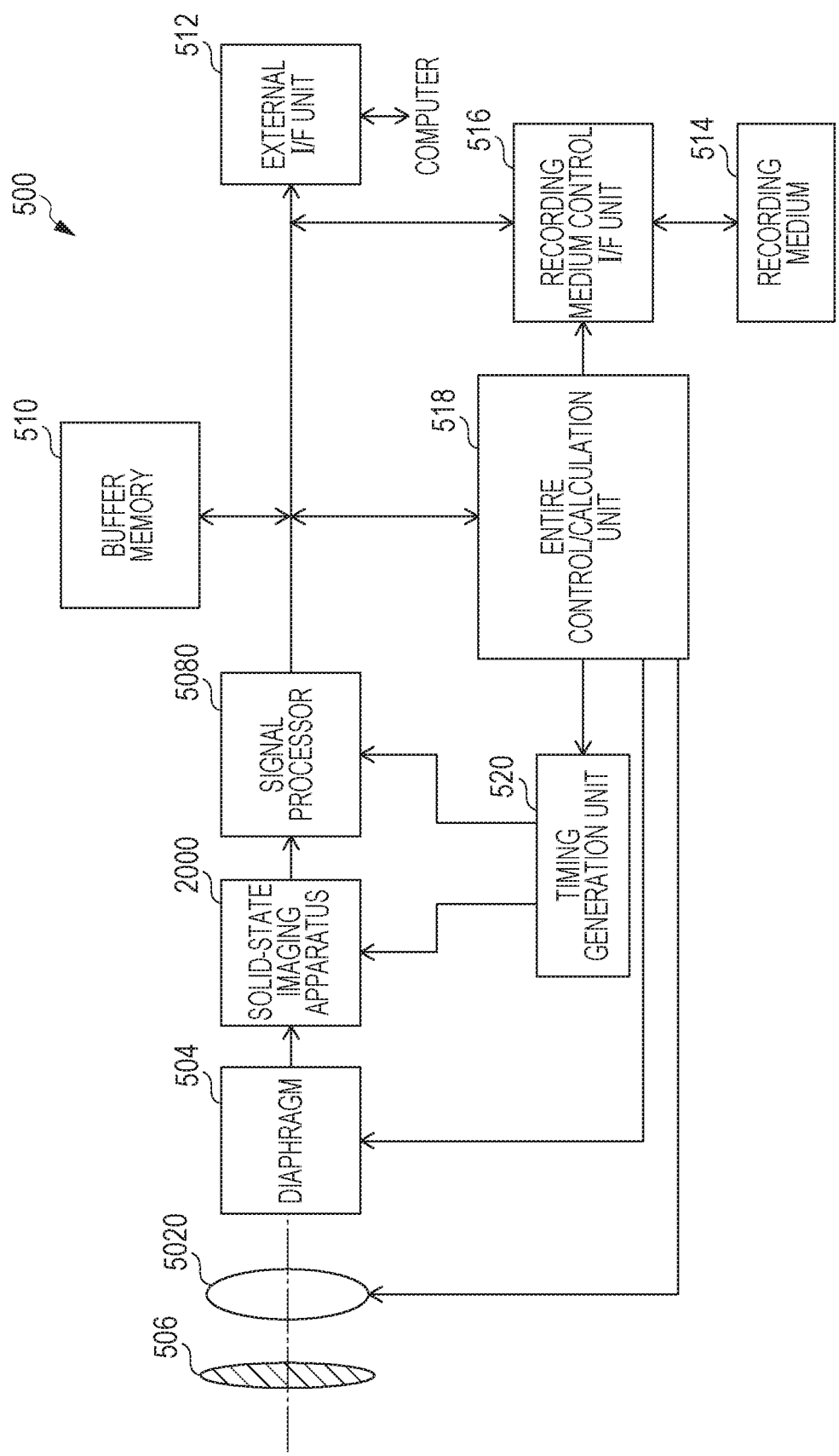
FIG. 8 is a diagram illustrating a configuration of an imaging system.

FIG. 8 is a block diagram illustrating a configuration of an imaging system 500 according to a third embodiment. The imaging system 500 of this embodiment includes an imaging apparatus 2000 employing one of the configurations of the imaging apparatus described in the foregoing embodiments. Examples of the imaging system 500 include a digital still camera, a digital camcorder, and a surveillance camera. In FIG. 8, an example of a configuration of a digital still camera employing one of the imaging apparatuses in the foregoing embodiments as the imaging apparatus 2000 is illustrated.

The imaging system 500 illustrated in FIG. 8 includes the imaging apparatus 2000, a lens 5020 which forms an image on the imaging apparatus 2000 using an optical image of an object, a diaphragm 504 which varies an amount of light which passes the lens 5020, and a barrier 506 for protection of the lens 5020. The lens 5020 and the diaphragm 504 are an optical system which collects light to the imaging apparatus 2000.

The imaging system 500 further includes a signal processor 5080 which performs a process on a signal output from the imaging apparatus 2000. The signal processor 5080 performs an operation of a signal process of performing various correction processes and compression on an input image where appropriate. The signal processor 5080 may have a function of performing an AD conversion process on a signal output from the imaging apparatus 2000. In this case, the imaging apparatus 2000 may not include an AD conversion circuit.

The imaging system 500 further includes a buffer memory unit 510 which temporarily stores image data and an external interface unit (an external OF unit) 512 used for communication with an external computer and the like. The imaging system 500 further includes a recording medium 514, such as a semiconductor memory, subjected to recording and reading of image data and a recording medium control interface unit (a recording medium control OF unit) 516 used to perform recording and reading on the recording medium 514. Note that the recording medium 514 may be incorporated in the imaging system 500 or may be detachable.

The imaging system 500 further includes an entire control/calculation unit 518 which performs various calculations and which controls the entire digital still camera and a timing generation unit 520 which outputs various timing signals to the imaging apparatus 2000 and the signal processor 5080. Here, the timing signals may be externally input, and the imaging system 500 at least includes the imaging apparatus 2000 and the signal processor 5080 which processes a signal output from the imaging apparatus 2000. The entire control/calculation unit 518 and the timing generation unit 520 may execute a number of or all control functions of the imaging apparatus 2000.

The imaging apparatus 2000 outputs an image signal to the signal processor 5080. The signal processor 5080 performs a predetermined signal process on the image signal output from the imaging apparatus 2000 and outputs image data. Furthermore, the signal processor 5080 generates an image using the image signal.

Use of one of the imaging apparatuses according to the foregoing embodiments realizes an image system capable of obtaining an image of higher quality.

Fourth Embodiment

An imaging system and a moving body according to a fourth embodiment will be described with reference to FIGS. 9A, 9B, and 10.

Figure 9A:
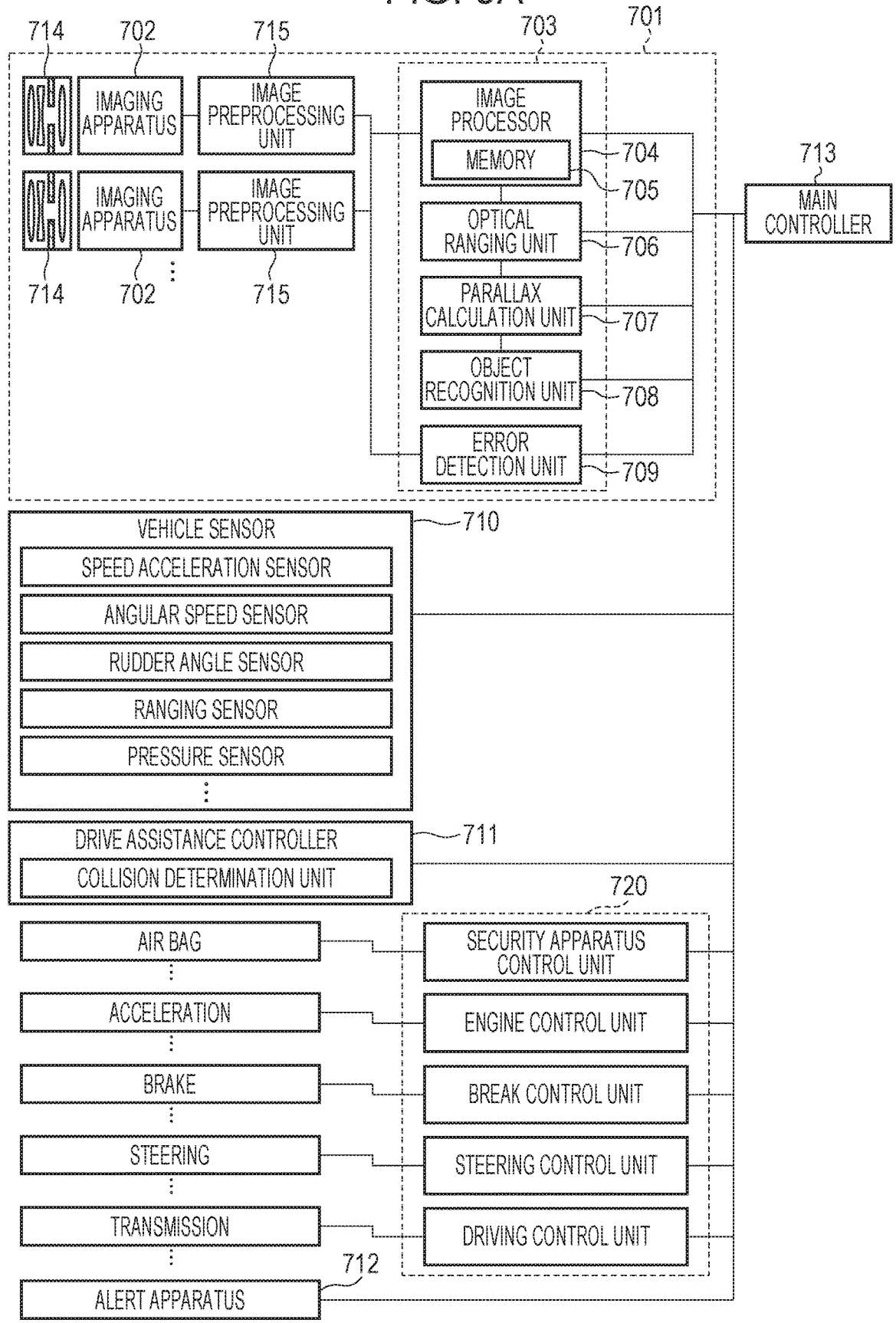
FIGS. 9A and 9B are diagrams illustrating an entire moving body.
Figure 9B:
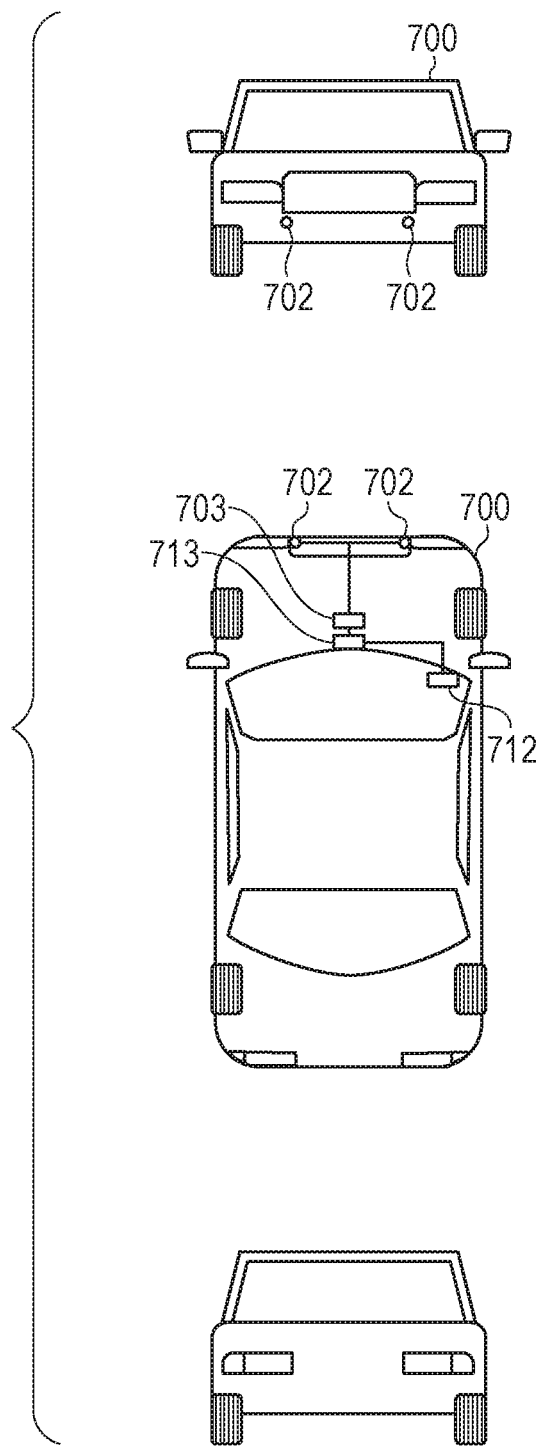
Figure 10:
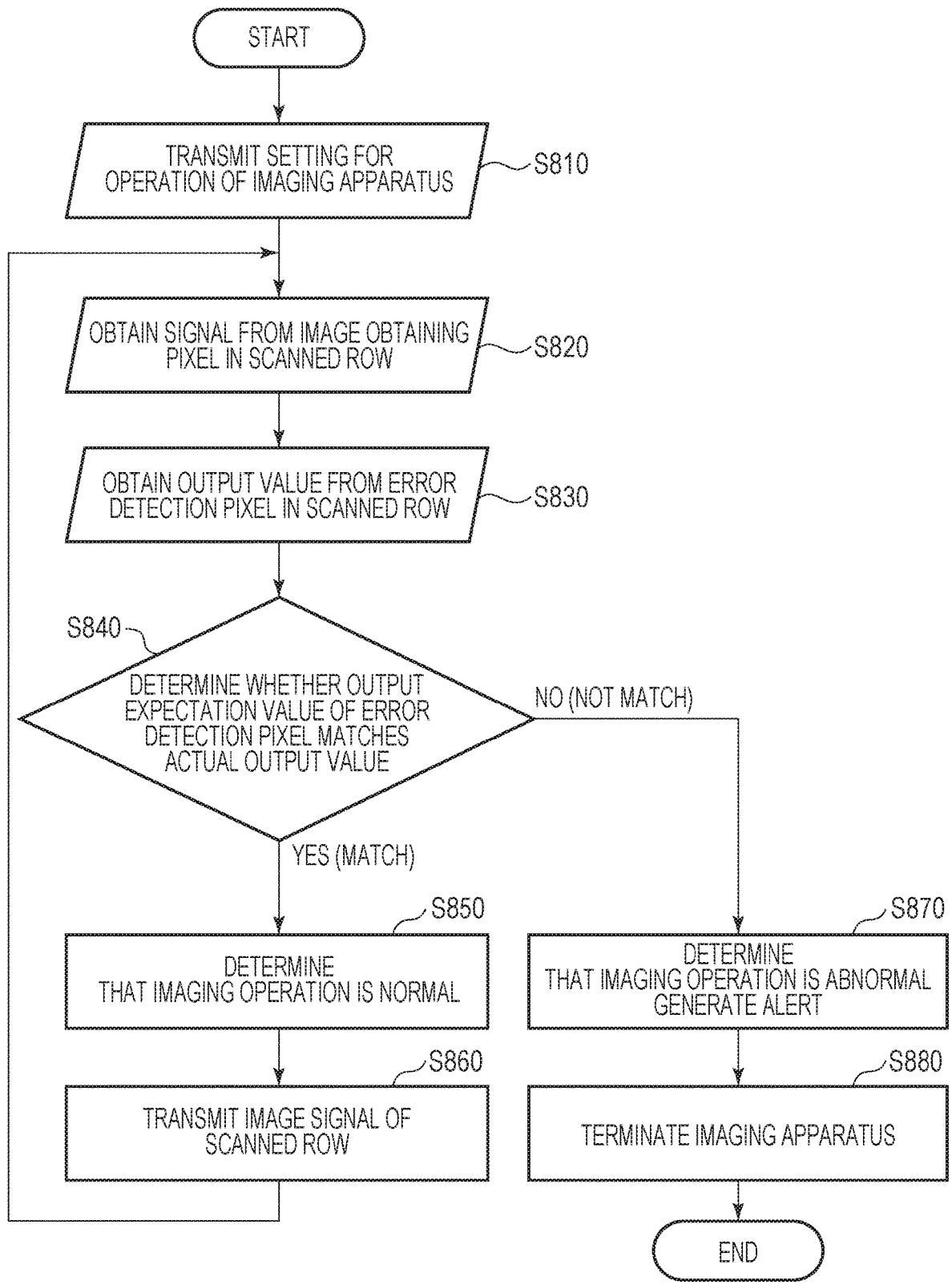
FIG. 10 is a flowchart illustrating control of the moving body.

FIGS. 9A and 9B are block diagrams illustrating a configuration of an imaging system and a moving body according to this embodiment. FIG. 10 is a flowchart of an operation of the imaging system according to this embodiment.

In this embodiment, an example of an imaging system associated with an on-vehicle camera will be described. In FIGS. 9A and 9B, an example of a vehicle system and an example of an imaging system installed in the vehicle system are illustrated. An imaging system 701 includes imaging apparatuses 702, image preprocessing units 715, an integrated circuit 703, and optical systems 714. Each of the optical systems 714 forms an optical image of an object in the imaging apparatus 702. Each of the imaging apparatus 702 converts the optical image of the object formed by the optical system 714 into an electric signal. Each of the imaging apparatus 702 is one of the imaging apparatuses according to the foregoing embodiments. The image preprocessing units 715 perform a predetermined signal process on signals output from the imaging apparatuses 702. The function of the image preprocessing units 715 may be incorporated in the imaging apparatuses 702. The imaging system 701 includes at least two groups of the optical system 714, the imaging apparatus 702, and the image preprocessing unit 715, and outputs from the image preprocessing units 715 in the individual groups are supplied to the integrated circuit 703.

The integrated circuit 703 is suitable for imaging systems and includes an image processor 704 including a memory 705, an optical ranging unit 706, a parallax calculation unit 707, an object recognition unit 708, and an error detection unit 709. The image processor 704 performs image processing including a developing process and defect correction on signals output from the image preprocessing units 715. The memory 705 serves as a primary storage for captured images and stores a defect position of imaging pixels. The optical ranging unit 706 performs focusing and ranging relative to the object. The parallax calculation unit 707 calculates a parallax (a phase difference between parallax images) using a plurality of image data obtained by the plurality of imaging apparatuses 702. The object recognition unit 708 performs recognition of an object, such as a vehicle, a road, a sign board, or a human. When detecting an error of one of the imaging apparatuses 702, the error detection unit 709 transmits an alert indicating the error to a main controller 713.

The integrated circuit 703 may be realized by dedicated hardware, a software module, or a combination of the dedicated hardware and the software module. Alternatively, the integrated circuit 703 may be realized by a field programmable gate array (FPGA), an application specific integrated circuit (ASIC), or a combination of the FPGA and the ASIC.

The main controller 713 integrates and controls operations of the imaging system 701, a vehicle sensor 710, a control unit 720, and the like. Note that the main controller 713 may not be provided and the imaging system 701, the vehicle sensor 710, and the control unit 720 may have respective communication interfaces so as to individually transmit and receive a control signal through a communication network (the CAN standard, for example).

The integrated circuit 703 has a function of transmitting a control signal and a setting value to the imaging apparatuses 702 in response to a control signal supplied from the main controller 713 or under control of a control unit of the integrated circuit 703. For example, the integrated circuit 703 transmits a setting for causing voltage switches included in the imaging apparatuses 702 to perform pulse driving, a setting for switching the voltage switches for each frame, and the like settings.

The imaging system 701 is connected to the vehicle sensor 710 and may detect an own-vehicle driving state including a vehicle speed, a yaw rate, and a rudder angle, an environment out of the own vehicle, and states of other vehicles and obstacles. The vehicle sensor 710 is also a distance information obtaining unit which obtains information on a distance from a parallax image to a target object. Furthermore, the imaging system 701 is connected to a drive assistance controller 711 which performs various driving assistances including self-steering, automatic circumambulation, and a collision avoidance function. In particular, as for a collision determination function, an estimation of collision against another vehicle or an obstacle and a determination as to whether collision has occurred are performed based on a result of detections performed by the imaging system 701 and the vehicle sensor 710. By this, avoidance control and activation of a safety apparatus are performed at a time when collision is expected.

Furthermore, the imaging system 701 is also connected to an alert apparatus 712 which generates an alert for a driver based on a result of the determination performed by the collision determination unit. For example, in a case where it is highly likely that collision is going to occur as a result of the determination performed by the collision determination unit, the main controller 713 performs vehicle control so as to avoid the collision and reduce damages by braking, deaccelerating, control of engine output, or the like. The alert apparatus 712 performs alert for the user by generating an alert, such as sound, by displaying alert information on a display unit screen of a car navigation system or a meter panel, or by applying vibration on a seat belt or a steering.

In this embodiment, the imaging system 701 images a portion around the vehicle, that is, a front side or a rear side of the vehicle. FIG. 9B is a diagram illustrating an example of installation of the imaging system 701 when the front of a vehicle is imaged by the imaging system 701.

Two imaging apparatuses 702 are disposed on a front side in a vehicle 700. Specifically, a center line relative to a traveling direction of the vehicle 700 or an appearance (a vehicle width, for example) is set as a symmetry axis and the two imaging apparatuses 702 are line-symmetrically disposed relative to the symmetrical axis. This state is sought for obtainment of information on a distance between the vehicle 700 and a target object and a determination of collision possibility. Furthermore, the imaging apparatuses 702 may be disposed so as not to disturb a field of view of a driver when the driver views a state of an outside of the vehicle 700. The alert apparatus 712 may be disposed in a position which is easily viewed by the driver.

Next, an error detection operation for detecting failure of each of the imaging apparatuses 702 included in the imaging system 701 will be described with reference to FIG. 10. The error detection operation is performed on the imaging apparatus 702 in accordance with step S810 to step S880 of FIG. 10.

In step S810, a setting of start-up of the imaging apparatus 702 is performed. Specifically, a setting for operating the imaging apparatus 702 is transmitted from an outside (the main controller 713, for example) of the imaging system 701 or an inside of the imaging system 701 so that an imaging operation of the imaging apparatus 702 and the error detection operation are started.

In step S820, pixel signals are obtained from effective pixels. In step S830, an output value from an error detection pixel disposed for error detection is obtained. The error detection pixel includes a photoelectric conversion unit similarly to the effective pixels. A predetermined voltage is written into the photoelectric conversion unit. The error detection pixel outputs a signal corresponding to the voltage written in the photoelectric conversion unit. Note that step S820 and step S830 may be replaced by each other.

In step S840, an output expectation value of an error detection pixel and an actual output value from an error detection pixel are compared with each other.

As a result of the comparison in step S840, when the output expectation value and the actual output value coincide with each other, the process proceeds to step S850 where it is determined that an imaging operation is appropriately executed, and thereafter, the process proceeds to step S860. In step S860, pixel signals in a scanned row are transmitted to the memory 705 and primarily stored in the memory 705. Thereafter, the process returns to step S820 and the error detection operation is continued.

On the other hand, as a result of the comparison in step S840, when the output expectation value and the actual output value do not coincide with each other, the process proceeds to step S870. In step S870, it is determined that an error has occurred in the imaging operation and transmits an alert to the main controller 713 or the alert apparatus 712. The alert apparatus 712 displays detection of an error in a display unit. Thereafter, the imaging apparatus 702 is stopped in step S880, and the operation of the imaging system 701 is terminated.

Note that, although the flowchart is looped for each row in this embodiment as an example, the flowchart may be looped every a plurality of rows or the error detection operation may be performed for each frame.

Note that the alert in step S870 may be transmitted to an outside of the vehicle through a wireless network.

Furthermore, although the control performed so as not to collide with other vehicles is illustrated in this embodiment, the present disclosure is applicable to control of automatic driving by following another vehicle and control of automatic driving so as not to protrude from a traffic lane. Furthermore, the imaging system 701 is applicable to a moving body (a moving apparatus) including a ship, an airplane, and industrial robot in addition to the vehicle including the own vehicle. The present disclosure is broadly applicable to, in addition to the moving body, apparatuses utilizing object recognition, such as an intelligent transport system (ITS).

MODIFICATIONS

In the present disclosure, various modifications may be made in addition to the foregoing embodiments.

For example, a case where a portion of the configuration of one of the embodiments is added to one of the other embodiments and a case where a portion of the configuration of one of the embodiments is replaced by a portion of a configuration of one of the other embodiments are also included in the present disclosure.

Furthermore, the foregoing embodiments are merely concrete examples of the present disclosure and the technical scope of the present disclosure is not limited by the examples. Specifically, the present disclosure may be embodied in various modes without departing from the technical scope and the main features thereof.

According to the present disclosure, accuracy of AD conversion using a ramp signal having a potential changed by a first changing amount may be improved.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2017-163473 filed Aug. 28, 2017, which is hereby incorporated by reference herein in its entirety.

What is claimed is:

1. An apparatus, comprising:
   a supply unit configured to supply a first ramp signal having a potential changed by a first changing amount per unit time and a second ramp signal having a potential changed by a second changing amount which is larger than the first changing amount per unit time;
   a first line configured to transmit the first ramp signal;
   a second line configured to transmit the second ramp signal; and
   analog/digital conversion units each of which is configured to be connected to the first and second lines, include a selection unit which outputs one of the first and second ramp signals and a comparison unit which performs a first comparison between the ramp signal output from the selection unit and an analog signal, and obtain a digital signal corresponding to the analog signal by the first comparison, wherein a first capacitance of an electric path extending from the supply unit through the first line to the selection unit is larger than a second capacitance of an electric path extending from the supply unit through the second line to the selection unit.

2. The apparatus according to claim 1, wherein the comparison unit performs a second comparison between the analog signal and a threshold value, when a result of the first comparison indicates that amplitude of the analog signal is smaller than the threshold value, the first ramp signal is used in the first comparison, and when a result of the first comparison indicates that the amplitude of the analog signal is larger than the threshold value, the second ramp signal is used in the first comparison.

3. The apparatus according to claim 2, wherein the supply unit generates the threshold value, and the threshold value is transmitted from the supply unit to the analog/digital conversion unit through the first line.

4. The apparatus according to claim 1, wherein the selection unit includes a first buffer connected to the first line and a second buffer connected to the second line, one of the first and second buffers being connected to the comparison unit, the first capacitance is disposed in an electric path extending from the supply unit to the first buffer, and the second capacitance is disposed in an electric path extending from the supply unit to the second buffer.

5. The apparatus according to claim 4, wherein the selection unit outputs one of the first and second ramp signals to the comparison unit by connecting one of the first and second buffers to the comparison unit.

6. An apparatus, comprising:

a supply unit configured to supply a first ramp signal having a potential changed by a first changing amount per unit time and a second ramp signal having a potential changed by a second changing amount which is larger than the first changing amount per unit time;

a first line configured to transmit the first ramp signal;

a second line configured to transmit the second ramp signal;

a first analog/digital conversion unit configured to have a first comparison unit which is connected to the first line and cause the first comparison unit to perform a first comparison between the first ramp signal and an analog signal so as to obtain a digital signal corresponding to the analog signal, and a second analog/digital conversion unit configured to have a second comparison unit which is connected to the second line and cause the second comparison unit to perform a second comparison between the second ramp signal and the analog signal used in the first comparison so as to obtain a digital signal corresponding to the analog signal, wherein a first capacitance of an electric path extending from the supply unit through the first line to the first comparison unit is larger than a second capacitance of an electric path extending from the supply unit through the second line to the first comparison unit.

7. The apparatus according to claim 1, further comprising a capacitor element connected to the first line so that the first capacitance is larger than the second capacitance.

8. The apparatus according to claim 6, further comprising a capacitor element connected to the first line so that the first capacitance is larger than the second capacitance.

9. The apparatus according to claim 7, wherein the capacitor element has a Metal-Insulator-Metal structure or a Metal-Oxide-Semiconductor structure.

10. The apparatus according to claim 8, wherein the capacitor element has a Metal-Insulator-Metal structure or a Metal-Oxide-Semiconductor structure.

11. The apparatus according to claim 7, further comprising:

a plurality of analog/digital conversion units including the first analog/digital conversion unit and the second analog/digital conversion unit, wherein the first analog/digital conversion unit has a shortest electric path extending to the supply unit in the first line, among the plurality of analog/digital conversion units, and the capacitor element is disposed in an electric path extending from the supply unit to the first analog/digital conversion unit in the first line.

12. The apparatus according to claim 8, further comprising:

a plurality of analog/digital conversion units including the first analog/digital conversion unit and the second analog/digital conversion unit, wherein the first analog/digital conversion unit has a shortest electric path extending to the supply unit in the first line, among the plurality of analog/digital conversion units, and the capacitor element is disposed in an electric path extending from the supply unit to the first analog/digital conversion unit in the first line.

13. The apparatus according to claim 7, further comprising a switch for performing switching between connection and disconnection between the capacitor element and the first line.

14. The apparatus according to claim 8, further comprising a switch for performing switching between connection and disconnection between the capacitor element and the first line.

15. The apparatus according to claim 1, further comprising:

pixels configured to output optical signals based on a charge generated by photoelectric conversion, wherein the analog signal is based on the optical signals.

16. The apparatus according to claim 6, further comprising:

pixels configured to output optical signals based on a charge generated by photoelectric conversion, wherein the analog signal is based on the optical signals.

17. The apparatus according to claim 7, further comprising:

pixels configured to output optical signals based on a charge generated by photoelectric conversion, and wherein the analog signal is based on the optical signals.

18. The apparatus according to claim 7, further comprising:

a first substrate configured to include the pixels; and a second substrate configured to include the analog/digital conversion units, wherein the capacitor element is disposed one of the first and second substrates.

19. The apparatus according to claim 1, wherein a width of the first line is larger than a width of the second line so that the first capacitance is larger than the second capacitance.

20. The apparatus according to claim 6, wherein a width of the first line is larger than a width of the second line so that the first capacitance is larger than the second capacitance.

21. A system, comprising:
the apparatus set forth in claim 15; and
a signal processor configured to generate an image by processing signals output from the apparatus.

22. A system, comprising:
the apparatus set forth in claim 16; and
a signal processor configured to generate an image by processing signals output from the apparatus.

23. A moving body, comprising:
the apparatus set forth in claim 15;
an obtaining unit configured to obtain information on a distance to an object using a parallax image generated based on signals supplied from the apparatus; and
a controller configured to control the moving body based on the distance information.

24. A moving body, comprising:
the apparatus set forth in claim 16;
an obtaining unit configured to obtain information on a distance to an object using a parallax image generated based on signals supplied from the apparatus; and
a controller configured to control the moving body based on the distance information.

25. The apparatus according to claim 8, further comprising:
pixels configured to output optical signals based on a charge generated by photoelectric conversion,
wherein the analog signal is based on the optical signals.

26. The apparatus according to claim 25, further comprising:
a first substrate configured to include the pixels;
a second substrate configured to include the analog/digital conversion units; and
a third substrate configured to include the capacitor element.

\* \* \* \* \*